United States Patent [19]
Collins et al.

[11] Patent Number: 5,210,466
[45] Date of Patent: May 11, 1993

[54] VHF/UHF REACTOR SYSTEM

[75] Inventors: Kenneth S. Collins, Morgan Hill; Craig A. Roderick, San Jose; Chan-Lon Yang, Los Gatos; David N. K. Wang, Saratoga; Dan Maydan, Los Altos, all of Calif.

[73] Assignee: Applied Materials, Inc., Santa Clara, Calif.

[21] Appl. No.: 852,826

[22] Filed: Mar. 13, 1992

Related U.S. Application Data

[63] Continuation of Ser. No. 559,947, Jul. 31, 1990, abandoned, which is a continuation-in-part of Ser. No. 416,750, Oct. 3, 1989, abandoned.

[51] Int. Cl.$^5$ .............................................. H05H 1/24
[52] U.S. Cl. ........................... 315/111.21; 313/231.31; 333/32
[58] Field of Search ............... 315/111.21, 111.81; 313/231.31; 331/74; 373/32

[56] References Cited

U.S. PATENT DOCUMENTS

| | | | |
|---|---|---|---|
| 4,373,581 | 2/1983 | Toellner | 333/32 X |
| 4,572,759 | 2/1986 | Benzing | 156/345 |
| 4,585,668 | 4/1986 | Asmussen et al. | 427/38 |
| 4,788,473 | 11/1988 | Mori et al. | 315/111.81 X |
| 4,792,732 | 12/1988 | O'Loughlin | 315/334 |
| 4,877,999 | 10/1989 | Knapp et al. | 315/248 |
| 4,906,898 | 3/1990 | Moisan | 315/111.21 X |
| 4,950,956 | 8/1990 | Asaraki et al. | 315/111.21 |
| 4,990,229 | 2/1991 | Campbell et al. | 315/111.41 X |
| 5,028,847 | 7/1991 | Greb et al. | 315/111.21 X |

FOREIGN PATENT DOCUMENTS

| | | |
|---|---|---|
| 0058820 | 9/1982 | European Pat. Off. |
| 0277460 | 8/1988 | European Pat. Off. |
| 0346131 | 6/1989 | European Pat. Off. |
| 0334638 | 9/1989 | European Pat. Off. |
| 0372179 | 9/1989 | European Pat. Off. |
| 3336652 | 4/1985 | Fed. Rep. of Germany |

OTHER PUBLICATIONS

Van Den Hoek et al, Power Loss Mechanisms . . . , J. Vacuum Science and Technology, No. 3 (1987).
Bias ECR Device, Patent Abstracts of Japan, vol. 14, No. 412 (1990).

Primary Examiner—Eugene R. LaRoche
Assistant Examiner—Do Hyun Yoo
Attorney, Agent, or Firm—Philip A. Dalton

[57] ABSTRACT

A plasma processing reactor is disclosed which incorporates an integral co-axial transmission line structure that effects low loss, very short transmission line coupling of ac power to the plasma chamber and therefore permits the effective use of VHF/UHF frequencies for generating a plasma. The use of VHF/UHF frequencies within the range 50–800 megahertz provides commercially viable processing rates (separate and simultaneous etching and deposition) and substantial reduction in sheath voltages compared to conventional frequencies such as 13.56 MHz. As a result, the probability of damaging electrically sensitive small geometry devices is reduced.

17 Claims, 3 Drawing Sheets

VHF/UHF REACTOR SYSTEM

CROSS REFERENCE TO RELATED APPLICATIONS

This is a continuation, of co-pending application Ser.No. 559,947, filed July 31, 1990 abandoned. which application is a continuation-in-part of application Ser. No. 07/416,750, now abandoned, entitled "A High Frequency Semiconductor Wafer Processing Apparatus and Method", filed Oct. 3, 1989 in the name of inventors Maydan et al, and assigned to the assignee of the present invention and application.

BACKGROUND OF THE INVENTION

1. Field of the Invention

The present invention relates to RF plasma processing reactors and, more particularly, to an inventive plasma reactor which uses UHF/VHF energy for generating the plasma.

2. Description of the Related Technology

The trend toward increasingly dense integrated geometries has resulted in components and devices of commensurately small geometry which are electrically sensitive and susceptible to damage when subjected to voltages as small as approximately 200 -300 volts. Unfortunately, such voltage are smaller in magnitude than the voltages to which the circuit components are subjected during standard integrated circuit fabrication processes.

Consider first prior art semiconductor processing systems such as CVD (chemical vapor deposition) and RIE (reactive ion etching) reactor systems. These systems may use radio frequency energy at low frequencies from about 10–500 KHz up to higher frequencies of about 13.56–40.68 MHz. Below about 1 MHz, ions and electrons can be accelerated by the oscillating electric field, and by any steady state electric field developed in the plasma. At such relatively low frequencies, the electrode sheath voltage produced at the wafers typically is up to one or more kilovolts peak, which is much higher than the damage threshold of 200–300 volts. Above several MHz, electrons are still able to follow the changing electric field. More massive ions are not able to follow the changing field, but are accelerated by steady state electric fields. In this frequency range (and at practical gas pressures and power levels), steady state sheath voltages are in the range of several hundred volts to 1,000 volts or more.

A favorite approach for decreasing the bias voltage involves applying a magnetic field to the plasma. This B field confines the electrons to the region near the surface of the wafer and increases the ion flux density and ion current and, thus, reduces the voltage and ion energy requirements. By way of comparison, an exemplary non-magnetic RIE process for etching silicon dioxide might use RF energy applied at 13.56 MHz, an asymmetrical system of 10–15 liters volume, 50 millitorr pressure and an anode area to wafer-support cathode area ratio of approximately (8–10) to 1, and develop wafer (cathode) sheath voltage of approximately 800 volts. The application of a magnetic field of 60 gauss may decrease the bias voltage approximately 25-30 percent, from 800 volts to about 500–600 volts, while increasing the etch rate by as much as about 50 percent.

However, the application of a stationary B field parallel to the wafer develops and $E \times B$ ion/electron drift and an associated plasma density gradient which is directed diametrically across the wafer. The plasma gradient results in non-uniform etching, deposition and other film properties across the wafer. The non-uniformities may be decreased by rotating the magnetic field around the wafer, typically either by mechanical movement of permanent magnets, or by using pairs of electromagnetic coils which are driven in quadrature, 90 degrees out of phase, or by instantaneously controlling the current in pairs of coils to step or otherwise move the magnetic field at a controlled rate. However, although rotating the field reduces the non-uniformity gradient, typically some degree of non-uniformity remains.

Furthermore, magnetic fields have the additional inherent disadvantage of being subject to variation due to the presence of windows, slit valves, hardware and other discontinuities. Thus, the use of magnetic fields requires a very careful chamber design which accounts for the effects of geometry and of various components on the magnetic field.

Finally, but not exhaustively, it is difficult to pack coils and, in particular, to pack two or more pairs of coils about a chamber and to achieve a compact system, especially when using a Helmholtz coil configuration and/or a multi-chamber system of individual magnetic-enhanced reactor chambers surrounding a common loadlock.

A unique reactor system which has the capability to instantaneously and selective alter the magnetic field strength and direction, and which is designed for use in compact multi-chamber reactor systems, is disclosed in commonly assigned U.S. Pat. No. 4,842,683, issued Jun. 27, 1989, in the name of inventors Cheng et al.

Other known reactor systems use microwave energy of frequencies >800 MHz and, typically, frequencies of 2.45 GHz to excite the plasma. This technique produces a high density plasma and low particle energies, resulting in minimum electrically-induced device damage. However, for many processes such as reactive ion etching of silicon dioxide, a minimum reaction threshold energy must be exceeded. In such processes, lower frequency power must be supplied in addition to the microwave power to produce voltage high enough to overcome the energy barrier. The resulting reactor system thus requires two power sources and matching networks and results in an expensive, complex system.

Although relatively high frequency VHF/UHF energy over the approximate range 50 MHz to 800 MHz has the potential for reducing the voltage seen by the wafers during plasma processing, it is understood that energy of this frequency has not been used in semiconductor processing reactors with any degree of commercial success. In part, this failure is due to the requirement of very short transmission lines at this range of frequencies and, in general, to the stringent system design requirements for efficient coupling of the energy to the chamber.

SUMMARY OF THE INVENTION

1. Objects

In view of the above discussion, it is one object of our present invention to provide a plasma reactor which uses high frequency ac energy to generate the plasma.

It is another object of our present invention to provide a plasma reactor which uses VHF/UHF energy to generate the plasma.

It is another, related object to provide a plasma reactor system which couples VHF/UHF energy into a vacuum chamber of the system for generating a plasma in a manner which accommodates the stringent high frequency VHF/UHF design requirements.

It is yet another object to provide a plasma reactor in which the reactor itself is configured as a transmission line structure for efficiently coupling high frequency energy such as VHF/UHF energy to the plasma chamber of the reactor.

It is still another, related object to provide a plasma reactor system which efficiently couples VHF/UHF energy into the vacuum chamber for generating a processing plasma which is characterized by sufficiently low electrode sheath voltages of, for example, 200–300 volts, to preclude electrical-induced damage to semiconductor devices during plasma processing thereof, while providing commercially viable deposition and etch rates for various conductor, insulator and semiconductor materials.

2. Summary

In one aspect, our invention which accomplishes the above and other objectives is embodied in a plasma processing reactor in which the reactor itself is configured as a transmission line structure for coupling ac energy directly to the plasma chamber.

In another respect, our invention is embodied in an RF powered plasma processing reactor comprising a plasma chamber and a wafer support electrode which is constructed to simulate the operation of a co-axial transmission line structure for coupling, ac energy to the chamber to form a plasma therein.

Preferably, the transmission line structure is adapted for coupling ac energy of frequency selected from the range of about 50 MHz to 800 MHz to the chamber.

Preferably, the transmission line structure provides an effective electrical length which is selected from (1) a length substantially less than a quarter wavelength at the frequency of interest and (2) a multiple, n=1, 2, etc., of a half wavelength at the frequency of interest.

In another aspect, our invention is embodied in a plasma processing reactor, comprising a housing which defines a plasma chamber therein; wafer-supporting cylindrical electrode means situated within the housing; a gas inlet manifold positioned in the housing for supplying reactant gas to the plasma chamber; vacuum pumping means; and an integral transmission line structure adapted to apply ac energy of selected frequency from an external source to the plasma chamber. The transmission line structure comprises (1) the cylindrical electrode means, an outer conductor surrounding the cylindrical electrode means and (2) an insulator between the cylindrical electrode means and (3) the outer conductor, such that the transmission line structure couples ac energy in the manner of a co-axial cable along the cylindrical electrode means to the plasma chamber and from the plasma chamber via the chamber housing to the outer conductor. Preferably, the plasma processing reactor includes an annular exhaust manifold which surrounds the outer electrode means. The manifold includes a conductive pumping screen surrounding the cylindrical electrode means. Exhaust gases flow radially in controlled manner from the periphery of the wafer support position through the pumping screen to the vacuum pumping means. The screen also electrically couples the chamber wall to the outer conductor for completing the current path to the outer conductor.

Our invention also encompasses a matching network adapted for efficiently coupling external ac energy to the transmission line structure. In a preferred, mating arrangement, the cylindrical electrode means comprises or is connected to a post electrode, the outer conductor comprises or is connected to a peripheral electrode and the matching network comprises a variable shunt capacitor and a variable series capacitor connected between the post electrode and the peripheral electrode.

BRIEF DESCRIPTION OF THE DRAWINGS

The above and other aspects of the invention are described in conjunction with the drawings, in which.

DETAILED DESCRIPTION OF THE PREFERRED EMBODIMENT(S)

1. Overview of Reactor System 10

Figure 1:
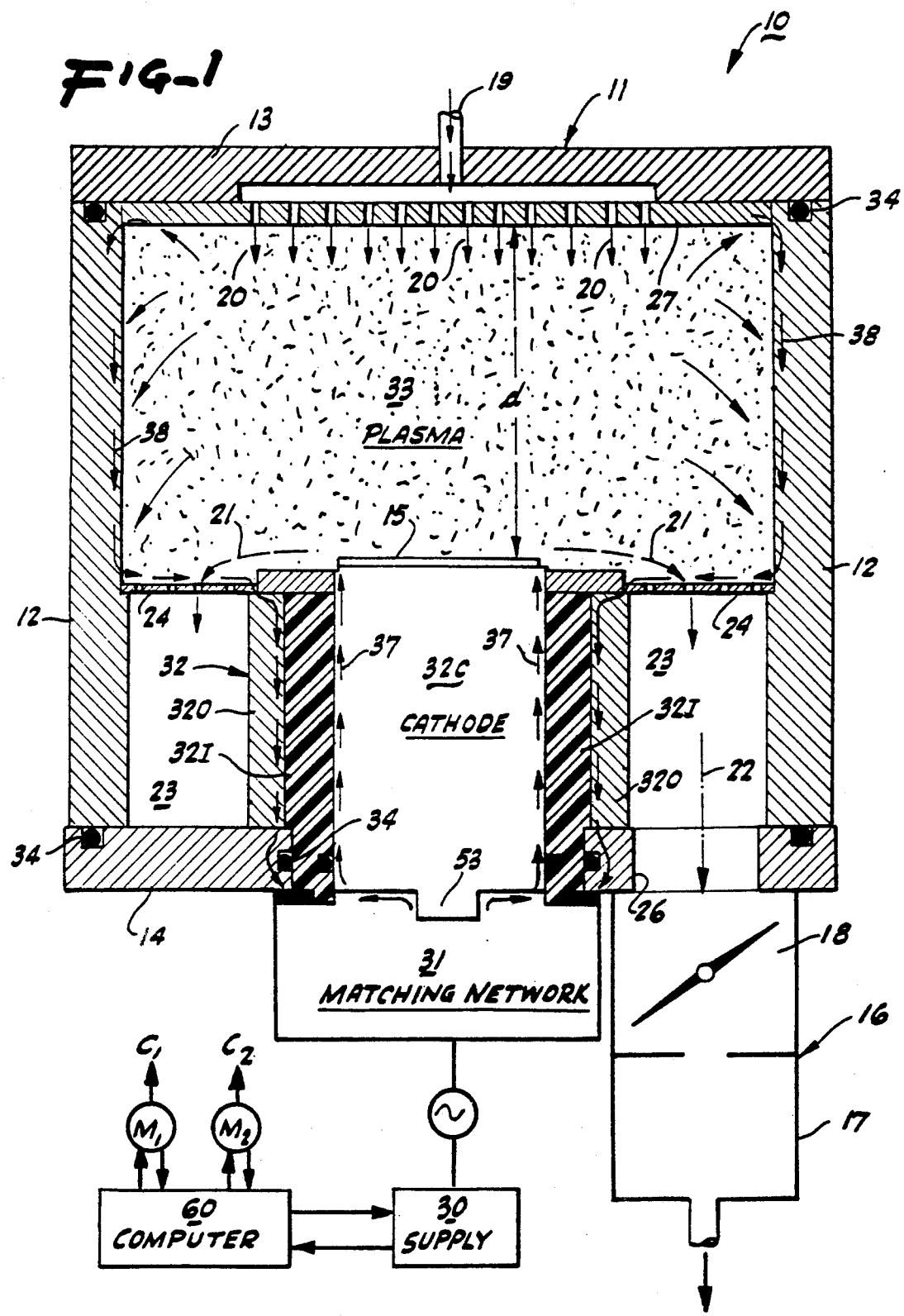
FIG. 1 is a schematic representation of our UHF/VHF plasma reactor system.

Referring to FIG. 1, there is shown a high frequency VHF/UHF reactor chamber system, designated generally by the reference numeral 10, which embodies our present invention. In one of the several unique aspects which are discussed below, the reactor itself is configured in part as a transmission line structure for applying high frequency plasma generating energy from a matching network to the plasma chamber 33. (Reference numeral 33 designates the chamber and the plasma therein.) This unique integral transmission line structure permits satisfaction of the requirement of a very short transmission line between the matching network and the load at the frequencies of primary interest, 50–800 MHz. It enables the efficient, controllable application of high frequency plasma generating energy to the plasma electrodes for generating commercially acceptable etch and deposition rates at low ion energies and low sheath voltages. The voltages are sufficiently low to preclude sensitive damage to electrically sensitive semiconductor devices. In addition, our VHF/UHF system avoids the assorted shortcomings of prior art technology such as ECR- and magnetic-enhanced technologies.

Our system 10 includes the above-mentioned vacuum chamber housing 11, formed of aluminum or other suitable material, having sidewalls 12 and top and bottom walls 13 and 14. Vacuum seals 34 such as O-rings are interposed between the various mating surfaces to maintain vacuum-tight enclosure. The interior of the chamber housing 11 is evacuated by a vacuum system 16 which includes one or more pumps. For example, the system 16 may comprise a turbomolecular pump 17 backed by a mechanical pump (not shown) and an optional roots blower (not shown), communicating with the chamber 33 via a throttle valve 18 which regulates pressure independent of flow rate. Of course, other modifications and arrangements may be used. For example, the turbomolecular pumps 17 may be omitted for many high pressure only systems.

Reactant gases are supplied to the chamber 11, as indicated schematically at 19, typically from one or more sources of pressurized gas via a computer-controlled flow controller (not shown) and enter the internal vacuum processing chamber 33 through gas manifold 27. The manifold may be a showerhead or other suitable design which supplies etching gas and/or deposition gas to the chamber 33 for developing an etching and/or deposition plasma upon application of high frequency RF energy. The high frequency ac energy such as, preferably, VHF/UHF energy of frequency 50-800 MHz is applied across electrode 32C (conventionally referred to as the system cathode), the upper surface of which supports wafer 15, and a second electrode (the system anode) which typically comprises the sidewalls 12, top wall 13 and/or manifold 27 of the reactor chamber. Again, other embodiments may be used. For example, in some high pressure applications and/or where an electrode area ratio of about 1:1 (anode area: cathode area ~1:1) is desired, it may be preferable to electrically isolate the chamber walls 12 from the plasma, i.e., to use two electrodes which are isolated from the chamber walls, rather than to use the chamber walls as the anode.

Other features which may be incorporated in the reactor chamber system 10 include, but are not limited to, the use of a fluid heat transfer medium to maintain the internal and/or external temperature of the gas inlet manifold 27 above or below a certain value or within a certain range; the use of fluid heat transfer medium to heat or cool the cathode 32C; the use of fluid heat transfer medium to heat or cool chamber walls 12 or top 13; resistive heating of the cathode 32C; the use of a gas heat transfer medium between the wafer 15 and the cathode 32C; and mechanical or electrostatic means for clamping the wafer 15 to the cathode 32C. Such features are disclosed in commonly assigned U.S. Pat. No. 4,872,947, issued Oct. 10, 1989, and commonly assigned U.S. Pat. No. 4,842,683, issued Jun. 27, 1989.

Our chamber design is useful for both high and low pressure operation, and the spacing, d, between the wafer support cathode 32C and the gas inlet manifold electrode 27 may be tailored for both high and low pressure operation. For example, high pressure operation at 500 millitorr-50 torr preferably uses spacing d≦about 5 centimeters, while for lower pressure operation over the range 2 millitorr-500 millitorr, a spacing d>5 centimeters may be preferable. The chamber may incorporate a fixed spacing d, as shown, or may utilize variable spacing designs such as interchangeable or telescoping upper chamber sections. The reactor system 10 is useful for high and low pressure deposition of materials such as silicon oxide and silicon nitride; low pressure anisotropic reactive ion etching of materials such as silicon dioxide, silicon nitride, silicon, polysilicon and aluminum; high pressure plasma etching of such materials; and CVD faceting involving simultaneous deposition and etchback of such materials. These and other processes for which reactor system 10 may be used are described in commonly assigned U.S. patent application Ser. No. 07/560,530, now abandoned, entitled "VHF/UHF PLASMA PROCESS FOR USE IN FORMING INTEGRATED CIRCUIT STRUCTURES ON SEMICONDUCTOR WAFERS", filed on even data in the name of Collins et al, which Collins et al patent application is incorporated by reference.

Preferably, the gas flow from the inlet manifold 27 is downward toward the wafer and is then pumped radially outward from the wafer 15. To this end, an annular vacuum manifold 23 is defined about the cathode transmission line structure 32, between chamber wall 12 on one side and the outer transmission line conductor 320 on the other, and between the chamber bottom wall 14 on the bottom and a conductive pumping screen 24 on the top. The manifold screen 24 is interposed between the vacuum manifold 23 and the plasma chamber 33 and provides a conductive electrical path between chamber walls 12 and the outer conductor 320 of the transmission line structure 32. The manifold 23 defines an annular pumping channel for implementing uniform radial pumping of exhaust gases from the periphery of wafer 15. The exhaust manifold 23 communicates into the exhaust gas system 16 via one or more apertures 26 in the bottom wall 14. The overall gas flow is along path 19 into the inlet manifold 27, then along path 20 from the inlet manifold toward wafer 15, along path 21 radially outwardly from the peripheral edge of the wafer and through screen 24 into the gas manifold, and along path 22 from the exhaust manifold 23 to the exhaust system 16.

Figure 2:
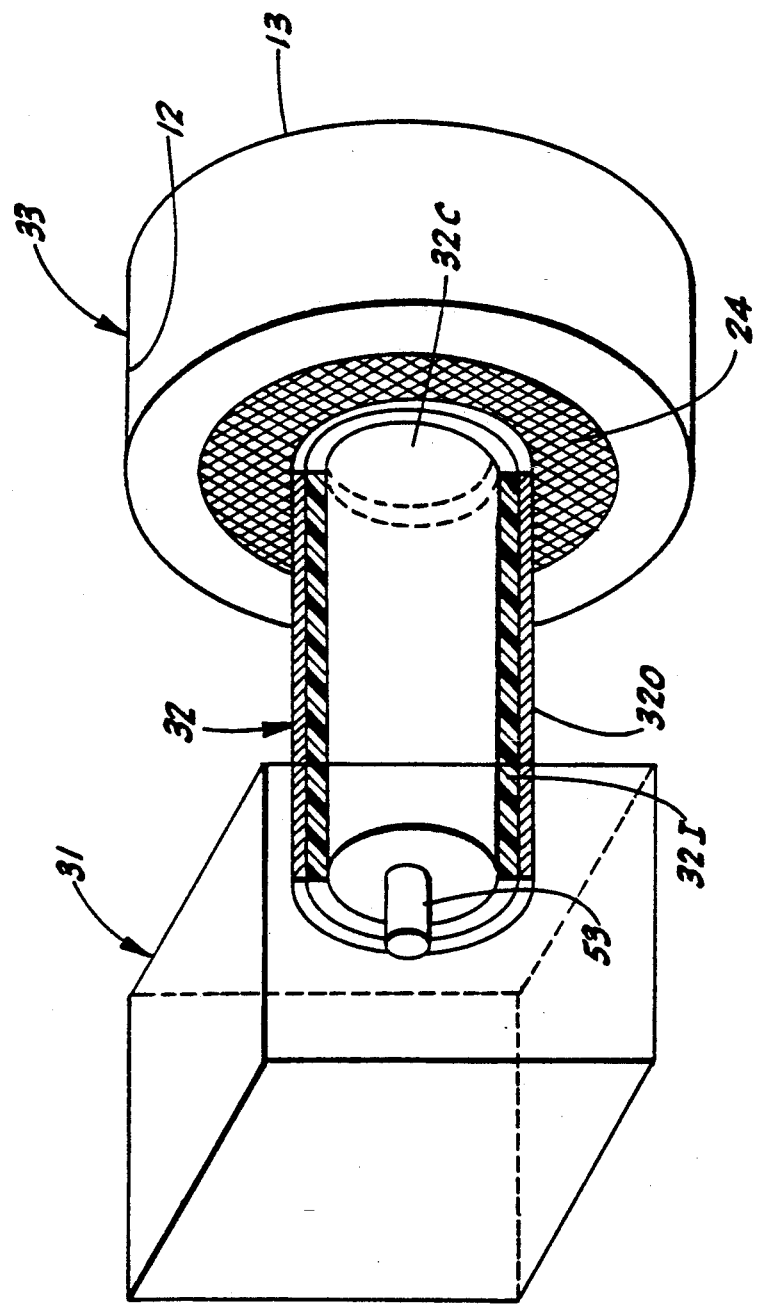
FIG. 2 depicts a schematic equivalent of the transmission line structure incorporated in the reactor in FIG. 1.

Referring further to FIG. 1 and to FIG. 2, the high frequency VHF/UHF energy of frequency 50-800 MHz from power supply 30 is input to a matching network 31 and from there coupled by chamber components, collectively identified by the reference numeral 32, to the chamber 33 and the plasma therein.

2. Transmission Line Requirements

As described below, the collective components 32 must, and do, approximate a very low loss co-axial transmission line, and also a very short co-axial transmission line to minimize transformation of the load impedance $Z_l$ so that the matching network 31 does not see an impedance that is very different from the load impedance.

The characteristic impedance $Z_o$ of the co-axial cable transmission line 32 is given by:

$$Z_0 = \frac{\sqrt{\frac{\mu}{\epsilon}}}{2\pi} \ln\left(\frac{r_0}{r_i}\right), \text{ where} \tag{1}$$

$\mu = \mu_0 \cdot \mu_r$ magnetic permeability,
$\mu_r = 1$ for non-magnetic materials,
$\mu_0 = 4\pi \times 10^{-7}$ Henry/meter,
$\epsilon = \epsilon_0 \cdot \epsilon_r$ dielectric permittivity,
$\epsilon_r =$ dielectric constant,
$\epsilon_0 = 8.85 \times 10^{-22}$ Farad/meter,
$r_0 =$ outer conductor, inside radius, and
$r_i =$ inner conductor radius.

$Z_{in}$, the input impedance to the transmission line structure where that structure is terminated by a plasma within the chamber (the impedance seen by the matching network) is a function of the characteristic impedance $Z_o$:

$$Z_{in} = Z_0 \frac{Z_L + jZ_0 \tan\beta 1}{Z_0 + jZ_L \tan\beta 1}, \tag{2}$$

where $Z_l$ is load impedance of the plasma, 1 being the physical length of the transmission line; and Beta is the phase constant, 2 pi/(lambda sub m), lambda sub m being the wavelength in the material of interest. Also, lambda sub m is (lambda sub fs)/square root ((epsilon sub r)×(mu sub r)), where epsilon sub r is the relative permittivity (dielectric constant), mu sub r is the relative permeability, and lambda sub fs is the wavelength in meters in free space, (300×10⁶ meters/sec)/(frequency, Hz).

From equation (2), if $Z_0 = Z_l$, the matching network sees the same impedance regardless of the length of the transmission line. However, if the equality is not satisfied, the transmission line impedance transforms load impedances $Z_1$ to some new impedance, but with lambda/2 periodicity. To minimize transformations, the transmission line should be very short, 1/10th to 1/20th of a wavelength of the ac energy at the highest frequency used. For prior art frequencies of, for example, 13.56 MHz, $lambda_{fs}$ is approximately equal to 22.1 meters. However, at the frequencies of interest of, for example, 300 MHz, $lambda_{fs}$ is much shorter, about 0.1 meter. Thus, at the high frequency 300 MHz, the transmission line structure between the match and the plasma load must be less than 0.05–0.1 meter so as to not exceed the maximum length requirement.

3. Transmission Line Structure 32

Proper high frequency co-axial/transmission line design here requires both a feed via a low characteristic impedance, short transmission line from the matching network to the wafer and a return path along the transmission line. This design requirement is satisfied by the transmission line structure 32 depicted in FIGS. 1 and 2 which comprises the cathode 32, concentric annular conductor 32O, and a non-porous low loss insulator 32I which surrounds the cathode 32C and insulates the cathode from the concentric annular conductor 32O and displaces process gases which otherwise might break down. For example, Teflon TM or quartz materials are preferred because they have high dielectric strength, low dielectric constant and low loss. The input side of this structure is connected to the matching network in a manner described below. The insulated cathode 32C and outer conductor 32O provide separate current paths between the matching network 31 and the plasma 33. One reversible current path 37 is from the matching network along the outer periphery of the cathode 32C to the plasma sheath at the upper electrode surface. The second reversible path 38 is from the plasma 33 along the gas manifold 27 and the upper inside section of chamber walls 12 then along the conductive exhaust manifold screen 24 and via the inside of the outer conductor 32O to the matching network. Please note, the exhaust manifold screen 24 is part of the uniform radial gas pumping system, and the return path for the RF current.

During application of alternating current energy, the RF current path alternates between the directions shown and the reverse directions. Due to the co-axial cable type of construction of the transmission line structure 32 and, more specifically, due to the higher internal impedance of the cathode 32C (relative to the outside thereof) and the higher impedance toward the outer surface of the conductor 32O (relative to the inner surface thereof), the RF current is forced to the outer surface of the cathode 32C and to the inner surface of the outer conductor 32O, in the manner of a co-axial transmission line. At the high VHF/UHF operational frequencies of interest, about 50–800 megahertz, these currents are concentrated in a surface thickness or skin which is only a few tenths of a mil in depth. However, the use of large wafers, for example, wafers 4–8 inches in diameter and the commensurately large diameter cathode 32C and large diameter outer conductor 32O provide large effective cross-section, low impedance current paths along the transmission line structure.

As indicated in equation (2) above, if the co-axial=-type transmission line structure 32 were terminated in a pure resistance equal to its characteristic impedance $Z_o$, then the matching network would see the constant impedance $Z_0$, independent of the length of the transmission line. However, such is not the case here, because the plasma is operating over a range of pressure, power and frequency and comprises different gases, which collectively vary the load impedance $Z_1$ that the plasma presents to the end of the transmission line 32. Because the load $Z_1$ is mismatched from the non-ideal (i.e., non-lossless) transmission line 32, standing waves present on the transmission line will increase resistive, dielectric, etc., losses between the transmission line and the matching network 31. Although the matching network 31 can be used to eliminate any standing waves and subsequent losses from the input of the matching network back to the amplifier or power supply 30, the matching network, transmission line feed 32 and plasma inside the chamber comprise a resonant system that increase the resistive, dielectric, etc., losses between the transmission line 32 and the matching network 31. In short, the load impedance $Z_1$ will be mismatched with losses, but losses are minimum when $Z_1 \sim Z_0$.

To diminish the losses due to the load mismatch, the co-axial-type transmission line structure 32 is designed to have a characteristic impedance $Z_0$ that is best suited to the range of load impedances associated with the plasma operation. Typically, for the above-described operating parameters and materials of interest, the series equivalent RC load impedance, $Z_1$, presented by the plasma to the transmission line will comprise a resistance within the approximate range 1 ohm to 30 ohms and a capacitance within the approximate range 50 pico farads to perhaps 400 pico farads. Consequently, we have chosen as the optimum a transmission line characteristic impedance $Z_0$ which is centered within the load impedance range, i.e., is approximately 10 to 15 ohms.

As further indicated in equation (2) above, it is necessary that the transmission line 32 be very short in order to avoid transformation of the plasma impedance that the matching network sees. Preferably, the transmission line is much less than a quarter wavelength, lambda/4, and, more preferably, is about (0.05 to 0.1) lambda. More generally, if it is not possible to locate the matching network at a distance much less than a quarter wavelength to the load, advantage is taken of the half wavelength periodicity associated with the impedance transformation by using a transmission line length equal to an integral multiple n=1, 2, 3, etc., of a half wavelength (lambda/2; lambda; 3lambda/2; etc.). More precisely, the preferred values are lambda/2 to (lambda/2+0.05 lambda); lambda to (lambda+0.05 lambda); 3lambda/2 to (3lambda/2+0.05 lambda); etc.). Under such conditions, the matching network should not be located at odd integrals of quarter wavelengths (lambda/4, 3lambda/4, 5lambda/4), because a quarter wave section (or n lambda/4 where n is odd) transforms $Z_1$ such that $Z_{in}=Z_0^2/Z_1$, where $Z_1$ is typically small, producing a very large $Z_{IN}$. The matching network then could not match to the plasma load and it would be very difficult to couple power to the plasma without unacceptable system resonance and power dissipation.

Also, for efficient coupling of power, the inside diameter (cross-section dimension) of the return conductor 32O must not be significantly larger than the outside diameter (cross-section dimension) of the center conductor 32C.

In short, the chamber incorporates a transmission line structure that couples VHF or UHF power of approximately 50–800 megahertz from the matching network 31 to the plasma 33.

That transmission line structure (1) preferably is very short compared to a quarter wavelength at the frequencies of interest or, alternatively, is approximately equal to an integral half wavelength, to prevent undesirable transformation of the plasma impedance; (2) has a characteristic $Z_o$ selected to suppress losses due to the presence of standing waves on the line between the plasma and the matching network; and (3) uses an outside conductor path cross-sectional dimension which is not substantially larger than that of the center conductor.

4. Matching Network

By keeping the physical length of the transmission line structure short compared to a quarter wavelength, i.e., preferably less than 1/10 or 1/20 of a wavelength or slightly greater than the multiple half wavelengths described above, there is a slight inductive component associated with the transmission line network when the load is a typical low series RC impedance. Normally, to match a resistive load, an L-network requires an inductance in series with the capacitance. However, because the very short transmission line structure 32 is terminated in a very low resistance, low impedance load, it presents an inductive component as well as a resistive component to the matching network. Although the plasma 33 is an RC load, the presence of the inductive component removes the requirement of an inductance inside the matching network. This allows a simple implementation of the matching network comprising two variable capacitors.

Figure 3:
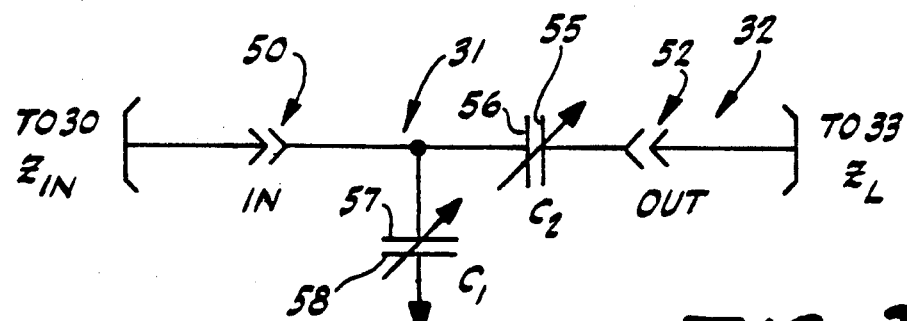
FIG. 3 is a circuit schematic of a suitable matching network.
Figure 4:
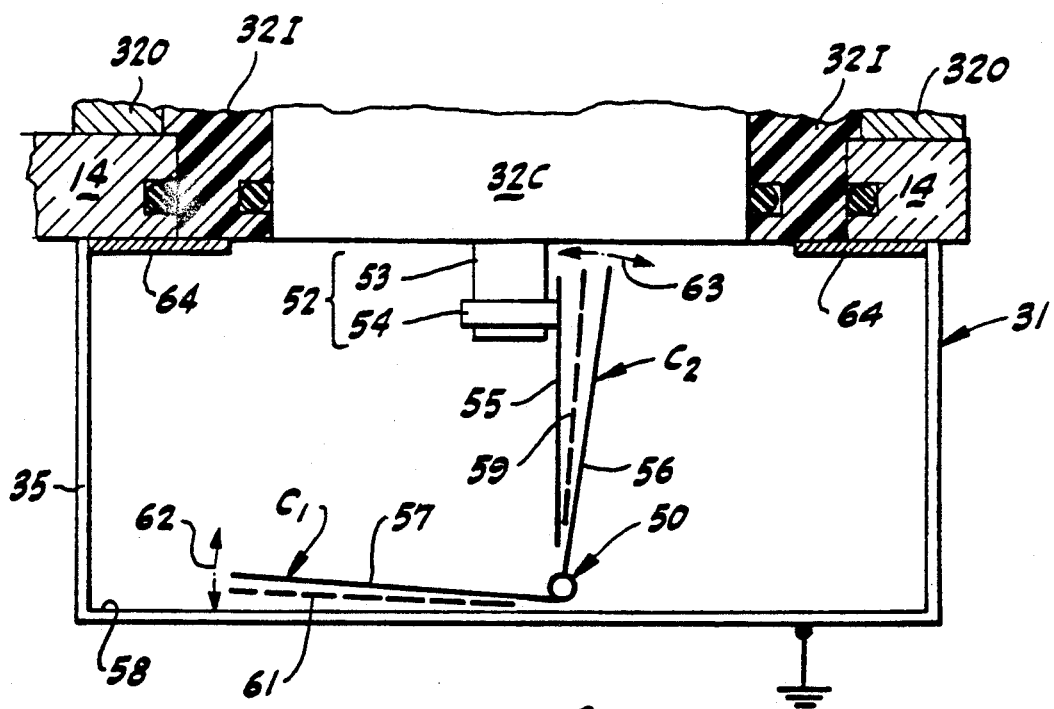
FIG. 4 schematically depicts the physical equivalent of the circuit schematic of FIG. 3.

Referring to FIGS. 3 and 4, a presently preferred matching network 31 is an L-network comprising a shunt capacitor $C_1$ coupled from the input of the matching network to ground and a series capacitor $C_2$ coupled from the input of the matching network to the output of the matching network, which ties directly to the input of the transmission line structure 32. It should be noted that the matching network configuration depicted in FIGS. 3 and 4 applies for a typical source output resistive impedance of 50 ohms and the typical plasma 33 resistive impedance component of 1 to 50 ohms and, more generally, when the source output resistance component is greater than the load resistance component. Were the resistive part of the plasma load impedance $Z_1$ to exceed the output resistive impedance of the source, the input and the output connections for the matching network would be reversed.

Capacitors $C_1$ and $C_2$ are air capacitors which comprise fixed and movable conductor plates, typically formed of copper or silver plated copper sheets. The fixed plate 58 of capacitor $C_1$ is the case or housing 35 of the matching network, which is connected to ground. Referring also to FIG. 1, plate 57 is connected to the input 50 from the power supply 30 and is movable along path 62 by motor $M_1$ under the control of the system computer 60, based upon real time $Z_{in}$ or reflected power. This input is used in controlling the plate separation and, thus, the capacitance of the capacitors in a well-known manner. A sheet 61 of Teflon TM or other suitable low loss, high dielectric strength material is interposed between the capacitor plates 57 and 58 to prevent arcing. Please note, as indicated schematically in FIG. 1, the computer 60 (or a separate computer) is conveniently used to control the operation of the power supply 30 and to select a proper frequency within the range of interest and thereby select the desired voltage and power combination for a given process. The ability to control the voltage and power by selecting from the large frequency of 50–800 MHz provides a very large process window.

Similarly constructed series capacitor $C_2$ comprises an insulative, anti-arcing sheet 59 of material such as Teflon TM, a leg 56 which is connected to the input 50 and is movable by motor $M_2$, in the manner of capacitor $C_1$, along path 63 to vary the capacitance of $C_2$. A fixed leg 55 is connected to the matching network output 52, which illustratively comprises a clip 54 which engages the downward-extending conductor post 53. The post is part of cathode 32C or is electrically connected to that cathode.

Typically, both movable capacitor legs are electrically connected to the input 50 by conductor straps formed of material such as copper. Annular electrode 64 between the bottom of the reactor chamber housing 12 and the top of the matching network case 35 couples the matching network 31 and the outer conductor 320 to the same potential, i.e. to system ground, and with the matching network output connection 52 establishes the necessary co-axial cable-type coupling or termination of the matching network 31 to the transmission line structure 32. Also, this construction capacitively couples the matching network to the transmission line structure, to block the DC bias when the sheath voltages are not equal.

For typical process parameters and the associated plasma RC impedance of 1–30 ohms in series with 50–400 picofarads, $C_1$ and $C_2$ will be varied over a range of, for example, 10–400 picofarads. Of course, where the very short transmission line conditions are not met, an inductor would be required in series with $C_2$. Those of usual skill in the art will readily derive and use other and standard matching network configurations which are suitable for our system. For example, an optional inductor may be incorporated in series with $C_2$, e.g., for operation at the lower frequencies of interest. Also, the matching network may include a separate DC blocking capacitor.

We claim:

1. A plasma processing reactor comprising:
   a housing having a wall defining a plasma chamber therein;
   wafer supporting cylindrical electrode means within the plasma chamber defining a wafer support position;
   a gas inlet manifold positioned in the housing for supplying reactant gas to the plasma chamber;
   vacuum pumping means; and
   an integral transmission line structure adapted to apply ac energy of selected frequency from an external source to the plasma chamber and comprising (1) the cylindrical electrode means; (2) an outer conductor surrounding the cylindrical electrode means; (3) means electrically connecting the outer conductor to the plasma chamber wall; and (4) an insulator between the cylindrical electrode means and the outer conductor, such that ac energy applied to the transmission line structure is coupled in the manner of a co-axial cable along the cylindrical electrode means to the plasma chamber and from the plasma chamber to the outer conductor.

2. The reactor of claim 1, further comprising a matching network adapted for contacting the electrode means and the outer conductor for coupling the ac energy to the transmission line structure.

3. The reactor of claim 2, wherein the cylindrical electrode means is electrically connected to a post electrode, the outer conductor is connected to or includes a peripheral electrode and the matching network comprises a first variable capacitor and a second variable capacitor connected between the post electrode and peripheral electrode.

4. The reactor of any of claims 1-3, wherein the length of the transmission line structure is substantially less than a quarter electrical wavelength at the selected frequency.

5. The plasma processing reactor of any of claims 1-3, wherein the frequency of the external energy is within the range about 50 MHz to about 800 MHz and wherein the length of the transmission line structure is substantially less than a quarter electrical wavelength at the selected frequency.

6. The plasma processing reactor of any of claims 1-3, wherein the physical length of the transmission line structure is n lambda/2 where n=1, 2, 3, etc., and lambda is the wavelength of the external ac energy at the selected frequency.

7. The plasma processing reactor of any of claims 1-3, wherein the frequency of the ac energy is selected from the range about 50 MHz–800 MHz and wherein the physical length of the transmission line structure is n lambda/2 wherein n=1, 2, 3, etc., and lambda is the wavelength at the selected frequency.

8. The plasma processing reactor of claim 1, wherein the ac energy is applied to the transmission line structure via a matching network comprising a first variable capacitor and a second variable capacitor.

9. The plasma processing reactor of claim 8, wherein the matching network further comprises an inductor in the series with the second variable capacitor.

10. A plasma processing reactor, comprising:
a chamber;
an electrode within said chamber, said electrode having a center conductor that provides a first reversible path for coupling high frequency AC energy from an energy source to a plasma within said chamber, a coaxial concentric outer conductor which provides a second reversible path for coupling the high frequency AC energy from the energy source to a plasma within said chamber, and a coaxial concentric dielectric interposed between said center conductor and said outer conductor, said electrode having a characteristic transmission impedance substantially corresponding to a chamber load impedance.

11. The plasma processing reactor of claim 10, further comprising:
a matching network for optimally coupling the high frequency AC energy from said energy source to said electrode.

12. The plasma processing reactor of claim 10, wherein said center conductor further comprises:
a wafer support.

13. The plasma processing reactor of claim 10, wherein said electrode further comprises:
a transmission line having an impedance from 5 to 50 Ohms.

14. The plasma processing reactor of claim 10, said high frequency AC energy being selected from a range of 50 MHz to 800 MHz.

15. The plasma processing reactor of claim 13, wherein the physical length of said transmission line is substantially less than a quarter electrical wavelength at a selected AC energy frequency.

16. The plasma processing reactor of claim 13, wherein the physical length of said transmission line is n lambda/2, where n=1, 2, 3, etc., and where lambda is the electrical wavelength at a selected AC energy frequency.

17. The plasma processing reactor of claim 11, wherein said matching network comprises:
a variable shunt capacitor; and
a variable series capacitor.

* * * * *